(12) United States Patent
Long et al.

(10) Patent No.: US 7,715,997 B2
(45) Date of Patent: May 11, 2010

(54) INTELLIGENT INSPECTION BASED ON TEST CHIP PROBE FAILURE MAPS

(75) Inventors: Garrett John Long, San Jose, CA (US); Saju Francis Olakengil, Sunnyvale, CA (US); Pramod Gaud, San Jose, CA (US); John Jacob Roberts, Berkeley, CA (US)

(73) Assignee: KLA-Tencor Technologies Corporation, San Jose, CA (US)

( * ) Notice: Subject to any disclaimer, the term of this patent is extended or adjusted under 35 U.S.C. 154(b) by 83 days.

(21) Appl. No.: 11/853,615

(22) Filed: Sep. 11, 2007

(65) Prior Publication Data

US 2009/0070055 A1 Mar. 12, 2009

(51) Int. Cl.
*G06F 19/00* (2006.01)
*G06F 11/00* (2006.01)
*G01B 21/30* (2006.01)
*G01N 21/88* (2006.01)

(52) U.S. Cl. .............................. 702/81; 73/432.1; 702/1; 702/127; 702/189; 716/1; 716/4; 716/5

(58) Field of Classification Search ................ 73/432.1, 73/865.9; 324/73.1, 158.1, 500, 509, 512, 324/527, 537, 754, 755, 758, 759, 761, 765; 702/1, 57, 58, 59, 81, 82, 83, 108, 117, 118, 702/123, 127, 182, 183, 187, 188, 189; 716/1, 716/4, 5, 6, 17
See application file for complete search history.

(56) References Cited

U.S. PATENT DOCUMENTS

| | | | | |
|---|---|---|---|---|
| 2,950,437 A | * | 8/1960 | Stahl | 324/73.1 |
| 2,996,666 A | * | 8/1961 | Baker | 324/73.1 |
| 3,082,374 A | * | 3/1963 | Buuck | 324/73.1 |
| 3,219,927 A | * | 11/1965 | Topp, Jr. et al. | 714/735 |
| 3,237,100 A | * | 2/1966 | Chalfin et al. | 324/108 |
| 3,522,532 A | * | 8/1970 | Mccoy | 324/73.1 |
| 5,173,719 A | * | 12/1992 | Taniguchi et al. | 356/394 |
| 5,545,570 A | | 8/1996 | Chung et al. | 999/8 |
| 6,365,425 B1 | | 4/2002 | Ikota et al. | 438/16 |
| 7,103,482 B2 | | 9/2006 | Steele et al. | 702/35 |
| 7,340,352 B2 | * | 3/2008 | Takahashi et al. | 702/35 |
| 2003/0179921 A1 | * | 9/2003 | Sakai et al. | 382/151 |
| 2007/0177135 A1 | * | 8/2007 | Tuohy | 356/237.2 |
| 2007/0202476 A1 | * | 8/2007 | Williamson | 434/236 |
| 2007/0255513 A1 | * | 11/2007 | Takahashi et al. | 702/35 |

FOREIGN PATENT DOCUMENTS

JP 2002-57195 * 2/2002

OTHER PUBLICATIONS

"The International Search Report and The Written Opinion of the International Searching Authority" dated Mar. 18, 2009 for International application No. PCT/US2008/074919.

* cited by examiner

*Primary Examiner*—Edward R Cosimano
(74) *Attorney, Agent, or Firm*—Joshua D. Isenberg; JDI Patent

(57) ABSTRACT

A method and system for semiconductor wafer inspection is disclosed. Each of a plurality of dies on a wafer may be probed with a probe tool to produce probe data. The probe data may be used to generate one or more non-repeating care areas. An inspection tool may use the non-repeating care areas to perform an inspection of the semiconductor wafer.

22 Claims, 2 Drawing Sheets

INTELLIGENT INSPECTION BASED ON TEST CHIP PROBE FAILURE MAPS

FIELD OF THE INVENTION

This invention generally relates to semiconductor processing and more specifically to die-based inspection of semiconductor chips.

BACKGROUND OF THE INVENTION

An important step in semiconductor device fabrication is electrical probe testing after some point in device fabrication has been reached. Typically, an electrical probe tester makes electrical contact with a particular die on a wafer at multiple test points. The electrical performance of the device structures may then be tested and probe data may be generated. Generally, probe data is utilized to calculate yields, fail rates, defect density, etc. Such data may be used to help improve device yield. Prior art methods include performing wafer probe testing and utilizing that data in traditional yield analysis techniques such as BITMAP, FIB, and yield modeling.

In addition to probe testing, semiconductor wafers may undergo inspection at various stages of device fabrication. Such inspection may be performed with optical or electron beam tools. Prior art methods inspection methods typically utilize die-based care area generation. In such methods, wafer inspection is performed on wafers in a repeating manner, such that a given care area for inspection is defined and then repeated uniformly by die across the given wafer. Prior art methods of wafer inspection include defining fixed care areas which repeat by die across the wafer with no prior knowledge of known bad areas. Each die is then inspected for defects at the repeating care areas.

Unfortunately, defects may not necessarily repeat from die to die. Therefore, prior art methods are often inefficient due to inspecting more area than required. In addition, prior art yield improvement techniques often operate without all possible data (such as defect images which would result from wafer inspection).

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Embodiments of the present invention use probe data to indicate specific failed areas (test structures) on a wafer prior to wafer inspection. This allows for inspection of a random set of care areas (test structures) based on probe data.

Figure 1:
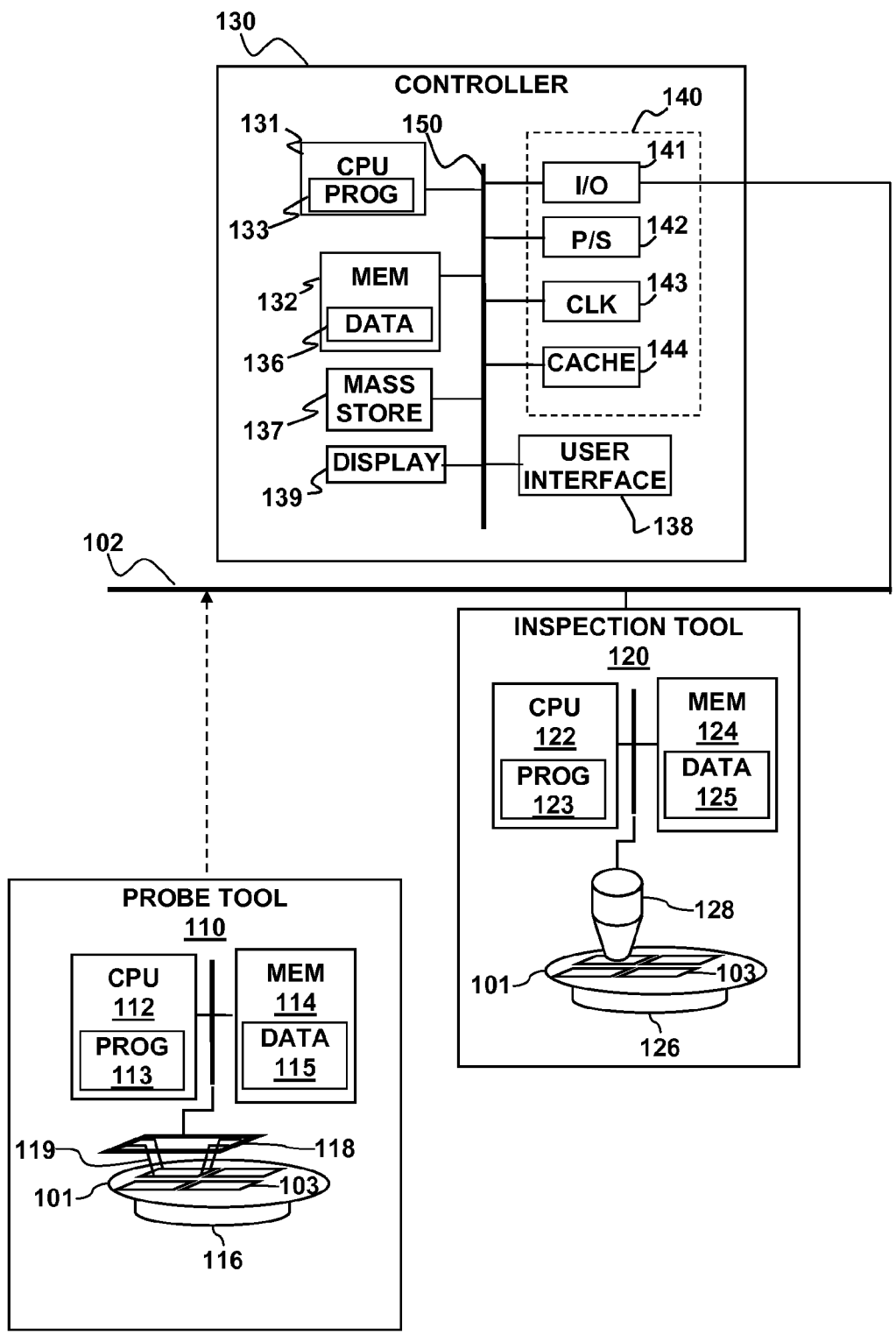
FIG. 1 is a schematic diagram of semiconductor wafer inspection system according to an embodiment of the present invention.

FIG. 1 illustrates a system 100 according to an embodiment of the present invention. The system 100 generally includes an inspection tool 120. The system 100 may optionally include a probe tool 110 and a controller 130 coupled to both the probe tool 110 and inspection tool 120. The probe tool 110, inspection tool 120, and controller 130 may communicate with each other through a data bus 102. Semiconductor wafers 101 may undergo fabrication-related processing in wafer processing tools (not shown) prior to probe testing with the probe tool 110. The processing may result in the formation, or partial formation, of integrated circuit structures on one or more device die 103 on the wafer 101. By way of example, the wafer 101 may be processed to a desired wafer level, e.g., Metal 1 copper CMP.

The system 100 is configured such that the inspection tool 120 performs an inspection of the wafer 101 using non-repeating care areas obtained from a probe measurements performed on the wafer with the probe tool 110. Each care area may be characterized by information identifying: (i) a particular die on the wafer within which the care area is located, (ii) a location of the care area within the particular die, and (iii) a size of the care area. By way of example, and without loss of generality, the care areas may be generated by the probe tool 110, the inspection tool 120 or the controller 130.

By way of example, the probe tool 110 may include a processor 112 and memory 114. The processor 112 may be programmed to implement certain operations according to a program 113. The memory 114 (e.g., RAM, DRAM, ROM, and the like) may contain data 115, which may be generated by the probe tool in response to the instructions of the program 113. The data 115 may also include parameters, initial values and other information used by the program 113. In some embodiments, the data 115 may include probe measurements obtained with the probe tool 110 and care areas generated from this data by the program 113. The probe tool may optionally include a wafer support 116, such as a chuck, that retains a wafer during probe testing. The wafer support may be configured to translate and/or rotate the wafer 101 to align it with a probe head 118. The probe tool 110 may be an electrical test probe tool having a probe card 118 with multiple electrical contact probes 119. The probes 119 may be brought into contact or close proximity with test points on a device die 103 either by moving the probe card 118 or the wafer 101 or some combination of both. Electrical measurements may be performed by applying voltage and/or or current to the probes 119 and measuring electrical properties such as resistance, capacitance or voltage-current characteristics of device structures formed on the wafer 101. The results of such measurements may be stored in digital format in the memory 114. One example, among others, of a commercially available probe tool that may be used as the probe tool 110 is a model EG600 Wafer Prober available from Electroglas, Inc. of San Jose, Calif.

It is noted that although the system 100 makes use of measurements from the probe tool 110 or care areas generated therefrom, the probe tool 110 need not be a part of the system 100 per se. Instead, the probe tool 110 may be remotely located at a separate facility from the other components of the system 100 and the probe data or care areas may be delivered to the system 100 by any suitable means. By way of example, the probe data and/or care areas may be stored in computer readable form on a storage medium, such as a diskette, compact disk, flash memory or similar device and transferred to the inspection tool 120 or controller 130 when the inspection tool 120 is available to inspect the wafer 101. Alternatively, the probe data and/or care areas may be transferred from the probe tool 110 to the inspection tool 120 and/or controller 130 in electronic form over the data bus 102.

The inspection tool 120 may also include a processor 122 and a memory 124. By way of example, the processor 122 may be configured to execute a program 123 that controls operation of the inspection tool. By way of example the program 123 may implement an inspection recipe. The memory 124 may contain data 125 used by the program to implement the inspection recipe. The data 125 may include probe measurements obtained with the probe tool 110 and care areas generated from this data by the program 123. The inspection tool 120 may further include a wafer support 126 and a tool head 128. By way of example, the tool head 128 may be an electron beam tool head including a source of primary electrons, beam-forming optics that direct the primary electrons towards a surface of the wafer 101, collection optics that collect signal radiation and directs it to a detector. The signal radiation may be any form of radiation scattered or otherwise emitted from the wafer 101 as a result of interaction between the primary electrons and the wafer 101. Alternatively, the tool head 128 may be an optical tool head including a source of primary electromagnetic radiation, beam-forming optics that direct the primary radiation towards a surface of the wafer 101, collection optics that collect signal radiation and directs it to a detector. The signal radiation may be any form of radiation scattered or otherwise emitted from the wafer 101 as a result of interaction between the primary radiation and the wafer 101.

Examples of suitable tools that may be used as the inspection tool 120 include, but are not limited to, high-resolution imaging inspection systems, SEM-based imaging inspection systems, backside inspection modules, patterned wafer inspection tools, broadband bright field inspection tools, macro defect inspection tools, optical surface analyzers, edge inspection tools, reticle inspection systems and the like. Examples of imaging inspection systems include series 2360 high-resolution imaging inspection systems from KLA-Tencor of San Jose, Calif. and equivalents. Examples of SEM-based inspection tools include series eS32 high-resolution imaging system from KLA-Tencor of San Jose, Calif. Examples of broadband bright-field inspection tools include 2800 series Broadband Bright field DUV/UV/visible inspection systems from KLA-Tencor of San Jose, Calif. and equivalents. Examples of backside inspection modules include SP1 series backside inspection modules from KLA-Tencor of San Jose, Calif. and equivalents. Examples of macro defect inspection tools include Viper 2430 systems from KLA-Tencor of San Jose, Calif. and equivalents. Examples of optical surface analyzers include Candela CS1 optical surface analyzers from KLA-Tencor of San Jose, Calif. and equivalents. Examples of edge inspection tools include VisEdge CV300 edge inspection systems from KLA-Tencor of San Jose, Calif. and equivalents. Examples of reticle inspection systems include TeraScan and TeraStar series systems from KLA-Tencor of San Jose, Calif. and equivalents. In alternative embodiments, the inspection tool 120 may be an electron beam inspection tool, such as a scanning electron microscope. Examples of scanning electron microscopes include eV300 defect review tools from KLA-Tencor and equivalents.

The controller 130 may include a central processor unit (CPU) 131 and a memory 132 (e.g., RAM, DRAM, ROM, and the like). The CPU 131 may execute a program 133, portions of which may be stored in the memory 132. The memory may contain data 136 related to operation of the probe tool 110 and/or inspection tool 120 as well as other tools coupled to the controller 130. The data 136 may include probe measurements obtained with the probe tool 110 and care areas generated from this data by the program 133.

By way of example, the program 133 may implement semiconductor wafer inspection on a wafer 101 with inspection tool 120 using probe data generated by the probe tool 110. Specifically, the program 133 may include instructions that use the probe data to generate one or more non-repeating care areas. As mentioned above, each care area may be characterized by information identifying: (i) a particular die on the wafer within which the care area is located, (ii) a location of the care area within the particular die, and (iii) a size of the care area. The program 133 may further include instructions that use the non-repeating care areas to perform an inspection of the wafer 101 with the inspection tool 120. The program 133 may optionally include instructions that, when executed, cause the probe tool 110 to probe each of a plurality of dies on the wafer 101 to produce the probe data.

The controller 130 may also include well-known support circuits 140, such as input/output (I/O) circuits 141, power supplies (P/S) 142, a clock (CLK) 143 and cache 144. The controller 130 may optionally include a mass storage device 137 such as a disk drive, CD-ROM drive, tape drive, or the like to store programs and/or data. The controller 130 may also optionally include a display unit 139 and user interface unit 138 to facilitate interaction between the controller 130 and a user. The display unit 139 may be in the form of a cathode ray tube (CRT) or flat panel screen that displays text, numerals, or graphical symbols. The user interface 138 may include a keyboard, mouse, joystick, light pen or other device. The preceding components may exchange signals with each other via an internal system bus 150. The controller 130 may be a general purpose computer that becomes a special purpose computer when running code that implements embodiments of the present invention as described herein.

Figure 2:
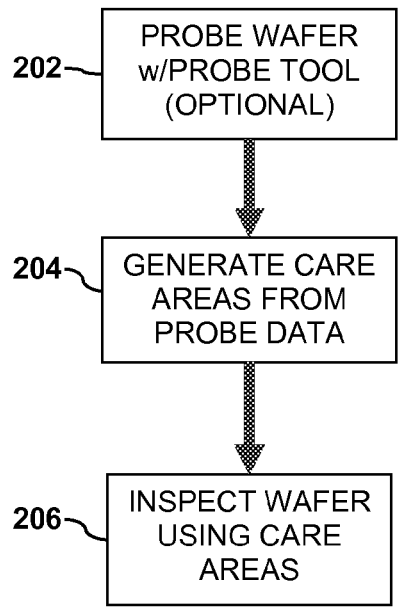
FIG. 2 is a flow diagram illustrating a semiconductor wafer inspection method according to an embodiment of the present invention.
Figure 3:
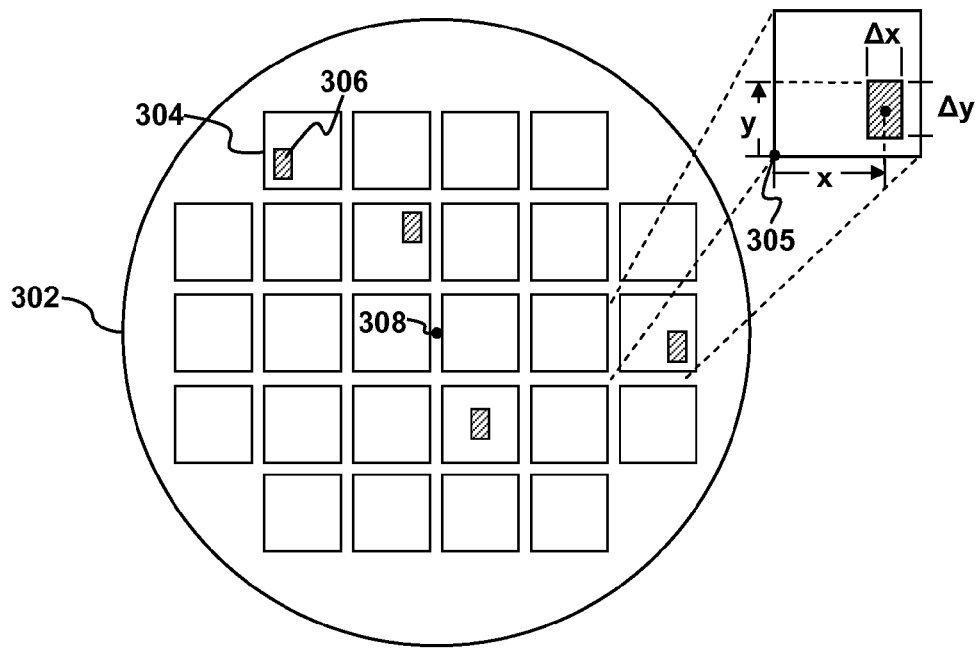
FIG. 3 is a plain view schematic diagram of an example of a failure map generated in accordance with an embodiment the present invention.

Embodiments of the present invention may be implemented according to a method 200 as shown in FIG. 2. According to the method 200, a standard wafer probe may optionally be performed, e.g., with the probe tool 110, as indicated at 202. Data obtained from the probe tool 110 may then be used to generate non-repeating care areas for the wafer 101 as indicated at 204. FIG. 3 illustrates a wafer map 302 that may be generated from the probe data. In the map 302, care areas are specified within selected die 304. Such care areas 306 for a given die 304 may be generated, e.g., by probing the die with the probe tool 110, and determining if any structures within the die fail any tests performed with the probe tool. By way of example, a probe test may check to see if there is any leakage current between structures that are supposed to be electrically isolated. If the probe data indicate that the leakage current is above an acceptable level, the location of the corresponding structure may be flagged as a care area. The corresponding structure may be determined from based on prior knowledge of the test chip design and layout of the die 304. It is noted that care areas 306 need not necessarily be identified for each die. Furthermore, a given die 304 may have two or more care areas. Each care area 306 may have an associated location and a corresponding size. By way of example, as shown in the inset to FIG. 3, the location of the care area 306 may be expressed in terms of orthogonal displacements, x, y with respect to a die origin 305 and the size may be expressed in terms of a corresponding length Δx and width Δy. In addition, it may be desirable to associate each care area 306 with a particular die 304 in which the care area is located.

The care areas generated at 204 may then be used for inspection of the wafer 101 with the inspection tool 120 as indicated at 206. Preferably, the care areas are converted into a format that is usable by the inspection tool 120. Specifically, the probe tool 110 and/or controller 130 may insert the care areas 306 into a specifically constructed application program interface (API) that inserts the care areas into the wafer inspection recipe implemented by the inspection tool program 123. The care areas may be referenced to a wafer origin 308, e.g. a wafer center or an off center origin. The inspection tool 120 may then inspect the care areas 306 to help determine the root cause of failure in the known bad test structures identified by the probe tool 110. Preferably, the wafer inspection recipe is specifically capable of managing non-repeating care areas. In particular, the inspection recipe implemented by the program 123 causes the inspection tool 120 to inspect one or more dies 304 on the wafer that contain one or more of the non-repeating care areas 306, but not to inspect any dies that do not contain any non-repeating care areas.

Embodiments of the present invention allow for more efficient inspection plans for semiconductor wafers based on test chip probe results. If specific failed areas are indicated for a particular die there is no requirement to inspect all repetitions of the care area in each die. Rather, the probe data may be used to generate a specific set of care areas for each wafer thereby optimizing the inspection time required. Embodiments of the present invention can significantly improve time to result through direct inspection of known bad test structures. The inspection tool 120 only inspects selected portions of selected dies. Thus, a reduced time to result may be obtained by only inspecting known bad areas on the wafer 101.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for semiconductor wafer inspection, comprising:
   a) generating one or more non-repeating care areas on a semiconductor wafer from probe data obtained from a probe measurement performed on the wafer, wherein each care area is characterized by information identifying: (i) a particular die on the wafer within which the care area is located, (ii) a location of the care area within the particular die, and (iii) a size of the care area; and/or
   b) using the non-repeating care areas to perform an inspection of the semiconductor wafer with an inspection tool.

2. The method of claim 1 wherein a) includes generating a failure map of the wafer from the probe data, wherein the failure map contains the non-repeating care areas.

3. The method of claim 1, wherein a) or b) includes converting the non-repeating care areas into a format that is usable by the inspection tool.

4. The method of claim 1, wherein b) includes inspecting one or more dies on the wafer that contain one or more of the non-repeating care areas but not inspecting any dies that do not contain one or more of the non-repeating care areas.

5. The method of claim 1 wherein the inspection tool is an optical inspection tool.

6. The method of claim 1 wherein the inspection tool is an electron beam inspection tool.

7. The method of claim 6 wherein the electron beam inspection tool is a scanning electron microscope.

8. The method of claim 1, further comprising c) probing each of a plurality of dies on a wafer with the probe tool to produce the probe data.

9. The method of claim 8 wherein c) includes performing an electrical probe test of one or more of the plurality of dies on the wafer.

10. The method of claim 8 wherein the probe tool is an electrical probe tool.

11. A system for semiconductor wafer inspection, comprising means for generating one or more non-repeating care areas on a wafer from probe data obtained from a probe measurement performed on the wafer, wherein each care area is characterized by information identifying: (i) a particular die on the wafer within which the care area is located, (ii) a location of the care area within the particular die, and (iii) a size of the care area; and
   an inspection tool configured to use the non-repeating care areas to perform an inspection of the semiconductor wafer.

12. The system of claim 11 wherein the means for generating the non-repeating care areas is configured to generate a failure map of the wafer from the probe data, wherein the failure map contains the non-repeating care areas, wherein the failure map is in a format that is usable by the inspection tool.

13. The system of claim 11 wherein the means for generating the non-repeating care areas includes a computer processor coupled to the probe tool, wherein the computer processor is configured to receive the probe data from the probe tool and generate the failure map of the wafer from the probe data.

14. The system of claim 13 wherein the computer processor is coupled to the inspection tool, wherein the computer processor is configured to generate the failure map in a format that is usable by the inspection tool.

15. The method of claim 11 wherein the inspection tool is an optical inspection tool.

16. The system of claim 11 wherein the inspection tool is an electron beam inspection tool.

17. The system of claim 16 wherein the electron beam inspection tool is a scanning electron microscope.

18. The system of claim 11, further comprising a probe tool configured to probe each of a plurality of dies on a wafer to produce the probe data.

19. The system of claim 18 wherein the probe tool is an electrical probe tool configured to perform an electrical probe test of one or more of the plurality of dies on the wafer.

20. The system of claim 18 wherein the probe tool is an electrical probe tool configured to perform an electrical probe test of each one of the plurality of dies on the wafer.

21. An article of manufacture comprising:
   a computer-readable medium having computer readable program code means embodied therein for implementing a method for semiconductor wafer inspection, the computer readable program code means comprising:

computer readable program code means that, when executed, generate one or more non-repeating care areas on a wafer from probe data obtained from a probe measurement performed on the wafer, wherein each care area is characterized by information identifying: (i) a particular die on the wafer within which the care area is located, (ii) a location of the care area within the particular die, and (iii) a size of the care area; and/or computer readable program code means that, when executed, use the non-repeating care areas to perform an inspection of the semiconductor wafer with an inspection tool.

22. A program storage device readable by a machine, tangibly embodying a program of instructions executable by the machine to perform method steps for semiconductor wafer inspection, the method steps comprising:
   a) generating one or more non-repeating care areas on a wafer from probe data obtained from a probe measurement performed on the wafer, wherein each care area is characterized by information identifying: (i) a particular die on the wafer within which the care area is located, (ii) a location of the care area within the particular die, and (iii) a size of the care area; and/or
   b) using the non-repeating care areas to perform an inspection of the semiconductor wafer with an inspection tool.

* * * * *